(12) United States Patent
Patterson

(10) Patent No.: US 7,752,183 B2
(45) Date of Patent: Jul. 6, 2010

(54) USING MD4 CHECKSUM AS PRIMARY KEYS TO LINK TRANSACTIONS ACROSS MACHINES

(75) Inventor: Bret Patterson, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 11/829,376

(22) Filed: Jul. 27, 2007

(65) Prior Publication Data

US 2007/0271216 A1 Nov. 22, 2007

Related U.S. Application Data

(63) Continuation of application No. 10/976,258, filed on Oct. 28, 2004, now Pat. No. 7,318,064.

(51) Int. Cl.
*G06F 7/00* (2006.01)
*G06F 17/00* (2006.01)

(52) U.S. Cl. .............. 707/697; 707/698; 707/699; 705/75; 708/136; 708/164; 717/126; 360/53

(58) Field of Classification Search .............. 707/1, 707/100, 102, 201, 999.001, 999.1, 999.102, 707/999.201; 709/202, 224; 711/141; 714/21, 714/807; 705/75; 708/136, 164; 717/126; 360/53
See application file for complete search history.

(56) References Cited

U.S. PATENT DOCUMENTS

| | | | | |
|---|---|---|---|---|
| 4,142,243 A | * | 2/1979 | Bishop et al. | 714/37 |
| 5,050,212 A | * | 9/1991 | Dyson | 713/187 |
| 5,247,524 A | * | 9/1993 | Callon | 714/807 |
| 5,598,530 A | * | 1/1997 | Nagae | 714/21 |
| 5,790,789 A | * | 8/1998 | Suarez | 709/202 |
| 5,806,075 A | * | 9/1998 | Jain et al. | 707/201 |
| 5,878,206 A | * | 3/1999 | Chen et al. | 714/19 |
| 6,148,292 A | * | 11/2000 | Reisinger et al. | 705/30 |
| 6,636,845 B2 | * | 10/2003 | Chau et al. | 707/1 |
| 6,641,312 B1 | * | 11/2003 | Chang et al. | 400/76 |
| 6,732,329 B2 | * | 5/2004 | Bace | 714/807 |
| 7,024,593 B1 | * | 4/2006 | Budd et al. | 714/48 |
| 7,289,992 B2 | * | 10/2007 | Walker | 707/8 |
| 7,441,008 B2 | * | 10/2008 | Johnson | 709/213 |
| 7,502,367 B2 | * | 3/2009 | Becher et al. | 370/389 |
| 7,562,229 B2 | * | 7/2009 | Circenis et al. | 713/187 |
| 2003/0023933 A1 | * | 1/2003 | Duncan | 714/807 |
| 2003/0163734 A1 | * | 8/2003 | Yoshimura et al. | 713/201 |
| 2003/0204480 A1 | * | 10/2003 | Heinrichs et al. | 707/1 |
| 2004/0122942 A1 | * | 6/2004 | Green et al. | 709/224 |
| 2005/0091188 A1 | * | 4/2005 | Pal et al. | 707/1 |

\* cited by examiner

*Primary Examiner*—John E Breene
*Assistant Examiner*—Phong Nguyen
(74) *Attorney, Agent, or Firm*—Yee & Associates, P.C.; Justin M. Dillon

(57) ABSTRACT

A method, system, and computer instructions for using MD4 checksum to link transactions across machines. Transaction information is received, wherein transaction information comprises a checksum and topology information, and wherein the checksum serves as a unique identifier of the current transaction. A first data structure is populated with the checksum and attribute information for the current transaction. A second data structure is then populated with the checksum and topology information for the current transaction, wherein populating the second table preserves a root/parent/current transaction relationship. Preserving the root/parent/current transaction relationship allows for automatically linking a transaction to its related transactions when the transaction is uploaded from a client to a transaction database.

33 Claims, 4 Drawing Sheets

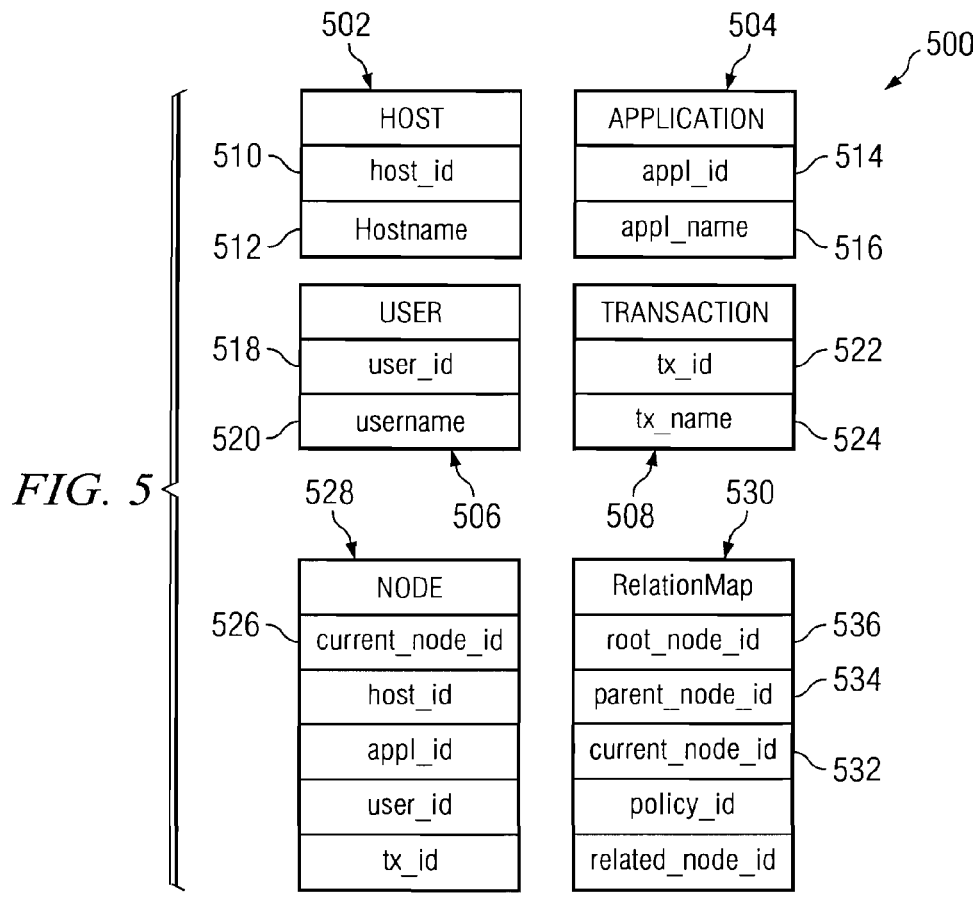
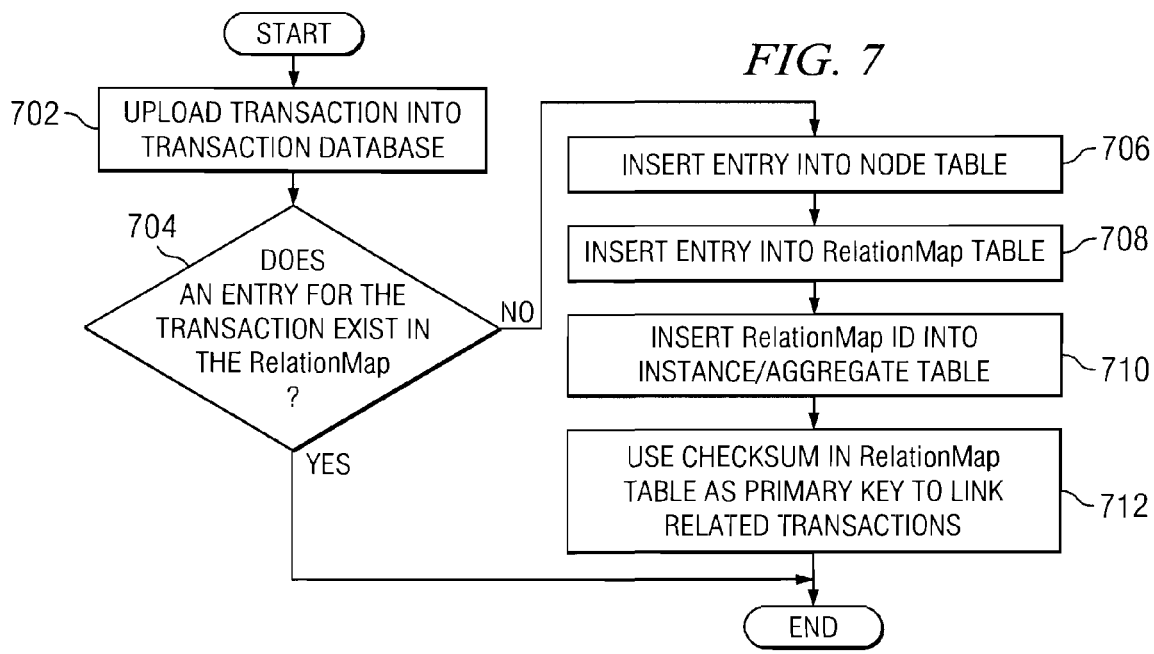

USING MD4 CHECKSUM AS PRIMARY KEYS TO LINK TRANSACTIONS ACROSS MACHINES

This application is a continuation of application Ser. No. 10/976,258, filed Oct. 28, 2004 now U.S. Pat. No. 7,318,064.

BACKGROUND OF THE INVENTION

1. Technical Field

The present invention relates generally to an improved data processing system. In particular, the present invention relates to a method, apparatus, and computer instructions for using the transaction MD4 checksum as primary keys to link transactions across machines.

2. Description of Related Art

Performance monitoring is often used in optimizing the use of software in a system. A performance monitor is generally regarded as a facility incorporated into a processor to assist in analyzing selected characteristics of a system by determining a machine's state at a particular point in time. One method of monitoring system performance is to monitor the system using a transactional-based view. In this manner, the performance monitor may access the end-user experience by tracking the execution path of a transaction to locate where problems occur. Thus, the end user's experience is taken into account in determining if the system is providing the service needed.

Tivoli Monitoring for Transaction Performance™ (hereafter TMTP) is a centrally managed suite of software components that monitor the availability and performance of Web-based services and operating system applications. TMTP captures detailed transaction and application performance data for all electronic business transactions. With TMTP, every step of a customer transaction as it passes through an array of hosts, systems, application, Web and proxy servers, Web application servers, middleware, database management software, and legacy back-office software, may be monitored and performance characteristic data compiled and stored in a data repository for historical analysis and long-term planning. One way in which this data may be compiled in order to test the performance of a system is to simulate customer transactions and collect "what-if" performance data to help assess the health of electronic business components and configurations. TMTP provides prompt and automated notification of performance problems when they are detected.

With TMTP, an electronic business owner may effectively measure how users experience the electronic business under different conditions and at different times. Most importantly, the electronic business owner may isolate the source of performance and availability problems as they occur so that these problems can be corrected before they produce expensive outages and lost revenue.

With TMTP, user transactions may be linked to sub-transactions using a correlator, such as an ARM (Application Response Measurement) correlator. Correlators are passed in user transactions to allow for monitoring the progress of the user transactions through the system. As an initiator of a transaction may invoke a process within an application and this invoked process can in turn invoke another process within the application, correlators are used to "tie" these related transactions together. For example, a parent transaction triggers a child transaction, which in turn may trigger its own child transaction. The result is a tree of transactions with the topmost parent transaction being the root of the tree. Thus, correlators are used to express a correlation between multiple transactions, e.g., a root/parent/child relationship.

The relationship between a particular transaction, its parent transaction, and the root transaction describes a point in the tree topology of a system of occurring transactions. Each transaction is identifiable by its particular ID, or Universal Unique IDentifier (UUID), which is a 128-bit value guaranteed to be unique across all servers and applications. As each of these transaction nodes in the tree topology may occur on the same or different hosts, these transactions are linked through UUIDs. These UUIDs are passed through the correlator to their child transactions.

A problem encountered in existing systems occurs when the transaction information arrives at a corresponding host node. As each host node may upload its transaction information at different times, these data uploads may be extremely large if network outages occur. These uploads have proven to be inefficient and time-consuming since processing time is needed to build the transaction's linkages when the transaction is uploaded to the host.

Therefore, it would be advantageous to have a method, system, and computer product for efficiently populating the transaction database on the server to preserve the root/parent/current transaction relationships by allowing automatic linking of the transaction topology as data is uploaded.

SUMMARY OF THE INVENTION

The present invention provides a method, system, and computer instructions for using checksums, such as MD4 checksums, as primary keys to link transactions across machines. Transaction information is received, wherein transaction information comprises a checksum and topology information, and wherein the checksum serves as a unique identifier of the current transaction. A first data structure is populated with the checksum and attribute information for the current transaction. A second data structure is then populated with the checksum and topology information for the current transaction, wherein populating the second table preserves a root/parent/current transaction relationship. Preserving the root/parent/current transaction relationship allows for automatically linking a transaction to its related transactions when the transaction is uploaded from a client to a transaction database.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 5 illustrates a database schema for implementing a preferred embodiment of the present invention;

FIG. 7 is a flowchart of a process for using MD4 checksum as primary keys to link transactions across machines in accordance with a preferred embodiment of the present invention.

DETAILED DESCRIPTION OF THE PREFERRED EMBODIMENT

Figure 1:
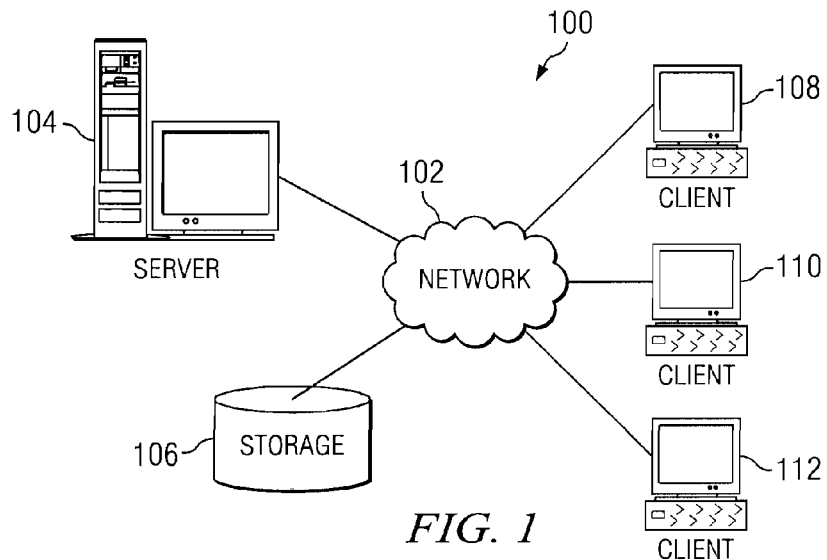
FIG. 1 is an exemplary diagram of a distributed data processing system in which the present invention may be implemented.

With reference now to the figures, FIG. 1 depicts a pictorial representation of a network of data processing systems in which the present invention may be implemented. Network data processing system 100 is a network of computers in which the present invention may be implemented. Network data processing system 100 contains a network 102, which is the medium used to provide communications links between various devices and computers connected together within network data processing system 100. Network 102 may include connections, such as wire, wireless communication links, or fiber optic cables.

In the depicted example, server 104 is connected to network 102 along with storage unit 106. In addition, clients 108, 110, and 112 are connected to network 102. These clients 108, 110, and 112 may be, for example, personal computers or network computers. In the depicted example, server 104 provides data, such as boot files, operating system images, and applications to clients 108-112. Clients 108, 110, and 112 are clients to server 104. Network data processing system 100 may include additional servers, clients, and other devices not shown. In the depicted example, network data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, government, educational and other computer systems that route data and messages. Of course, network data processing system 100 also may be implemented as a number of different types of networks, such as for example, an intranet, a local area network (LAN), or a wide area network (WAN). FIG. 1 is intended as an example, and not as an architectural limitation for the present invention.

Figure 2:
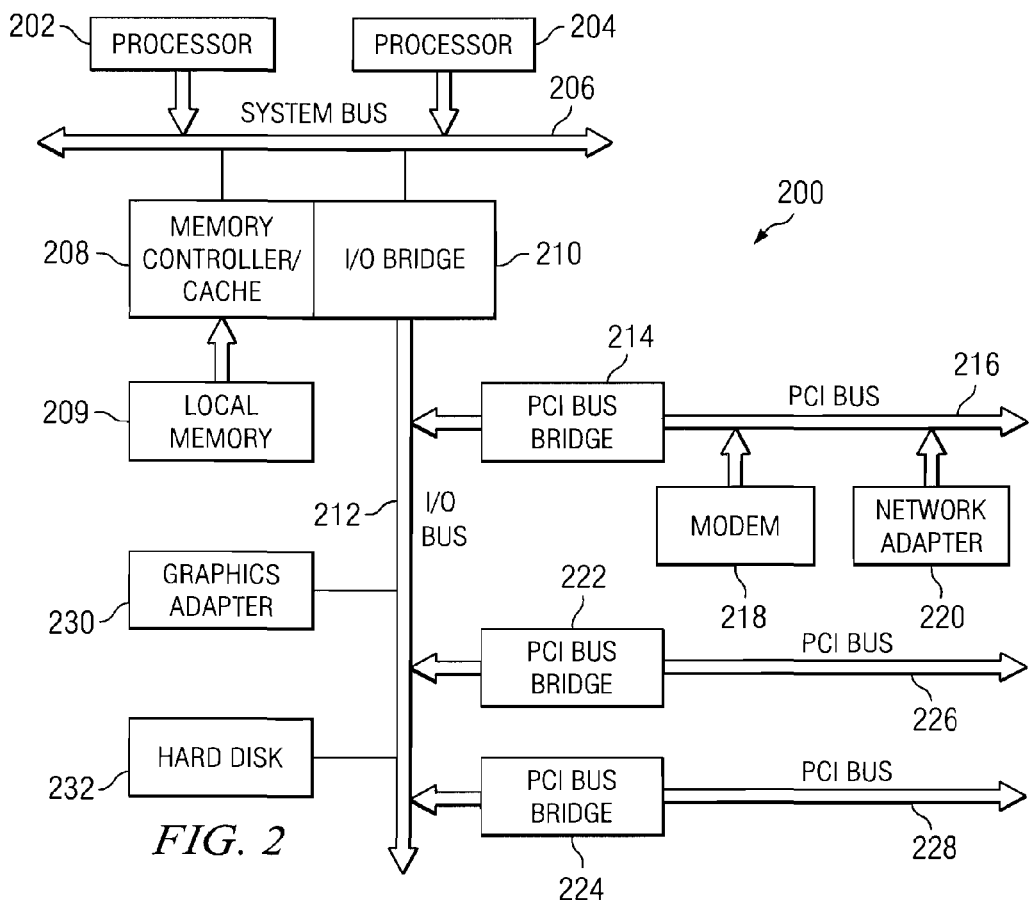
FIG. 2 is an exemplary diagram of a server computing device which may be used to send transactions to elements of the present invention.

Referring to FIG. 2, a block diagram of a data processing system that may be implemented as a server, such as server 104 in FIG. 1, is depicted in accordance with a preferred embodiment of the present invention. Data processing system 200 may be a symmetric multiprocessor (SMP) system including a plurality of processors 202 and 204 connected to system bus 206. Alternatively, a single processor system may be employed. Also connected to system bus 206 is memory controller/cache 208, which provides an interface to local memory 209. I/O bus bridge 210 is connected to system bus 206 and provides an interface to I/O bus 212. Memory controller/cache 208 and I/O bus bridge 210 may be integrated as depicted.

Peripheral component interconnect (PCI) bus bridge 214 connected to I/O bus 212 provides an interface to PCI local bus 216. A number of modems may be connected to PCI local bus 216. Typical PCI bus implementations will support four PCI expansion slots or add-in connectors. Communications links to clients 108-112 in FIG. 1 may be provided through modem 218 and network adapter 220 connected to PCI local bus 216 through add-in connectors.

Additional PCI bus bridges 222 and 224 provide interfaces for additional PCI local buses 226 and 228, from which additional modems or network adapters may be supported. In this manner, data processing system 200 allows connections to multiple network computers. A memory-mapped graphics adapter 230 and hard disk 232 may also be connected to I/O bus 212 as depicted, either-directly or indirectly.

Those of ordinary skill in the art will appreciate that the hardware depicted in FIG. 2 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 2 may be, for example, an IBM eServer pSeries system, a product of International Business Machines Corporation in Armonk, N.Y., running the Advanced Interactive Executive (AIX) operating system or LINUX operating system.

Figure 3:
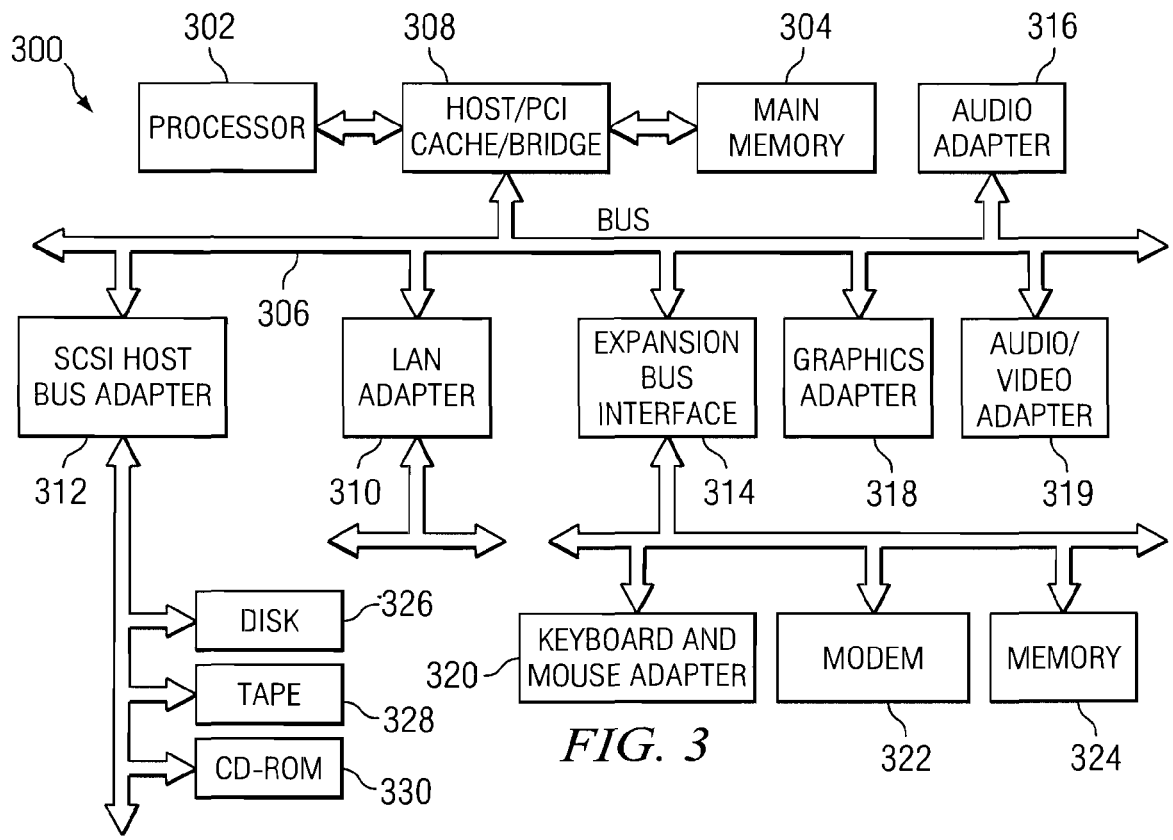
FIG. 3 is an exemplary diagram of a client computing device upon which elements of the present invention may be implemented.

With reference now to FIG. 3, a block diagram illustrating a data processing system is depicted in which the present invention may be implemented. Data processing system 300 is an example of a client computer. Data processing system 300 employs a peripheral component interconnect (PCI) local bus architecture. Although the depicted example employs a PCI bus, other bus architectures such as Accelerated Graphics Port (AGP) and Industry Standard Architecture (ISA) may be used. Processor 302 and main memory 304 are connected to PCI local bus 306 through PCI bridge 308. PCI bridge 308 also may include an integrated memory controller and cache memory for processor 302. Additional connections to PCI local bus 306 may be made through direct component interconnection or through add-in boards. In the depicted example, local area network (LAN) adapter 310, SCSI host bus adapter 312, and expansion bus interface 314 are connected to PCI local bus 306 by direct component connection. In contrast, audio adapter 316, graphics adapter 318, and audio/video adapter 319 are connected to PCI local bus 306 by add-in boards inserted into expansion slots. Expansion bus interface 314 provides a connection for a keyboard and mouse adapter 320, modem 322, and additional memory 324. Small computer system interface (SCSI) host bus adapter 312 provides a connection for hard disk drive 326, tape drive 328, and CD-ROM drive 330. Typical PCI local bus implementations will support three or four PCI expansion slots or add-in connectors.

An operating system runs on processor 302 and is used to coordinate and provide control of various components within data processing system 300 in FIG. 3. The operating system may be a commercially available operating system, such as Windows XP, which is available from Microsoft Corporation. An object oriented programming system such as Java may run in conjunction with the operating system and provide calls to the operating system from Java programs or applications executing on data processing system 300. "Java" is a trademark of Sun Microsystems, Inc. Instructions for the operating system, the object-oriented programming system, and applications or programs are located on storage devices, such as hard disk drive 326, and may be loaded into main memory 304 for execution by processor 302.

Those of ordinary skill in the art will appreciate that the hardware in FIG. 3 may vary depending-on the implementation. Other internal hardware or peripheral devices, such as flash read-only memory (ROM), equivalent nonvolatile memory, or optical disk drives and the like, may be used in addition to or in place of the hardware depicted in FIG. 3. Also, the processes of the present invention may be applied to a multiprocessor data processing system.

As another example, data processing system 300 may be a stand-alone system configured to be bootable without relying on some type of network communication interfaces. As a further example, data processing system 300 may be a personal digital assistant (PDA) device, which is configured with ROM and/or flash ROM in order to provide non-volatile memory for storing operating system files and/or user-generated data.

The depicted example in FIG. 3 and above-described examples are not meant to imply architectural limitations. For example, data processing system 300 also may be a notebook computer or hand held computer in addition to taking the form of a PDA. Data processing system 300 also may be a kiosk or a Web appliance.

One or more servers, such as server 104 in FIG. 1, may provide Web services of an electronic business for access by client devices, such as clients 108, 110 and 112. With the present invention, a transaction performance monitoring system is provided for monitoring performance of components of the Web server and its enterprise back end systems in order to provide data representative of the enterprise business' performance in handling transactions. In one exemplary embodiment of the present invention, this transaction performance monitoring system is IBM Tivoli Monitoring for Transaction Performance™ (TMTP), which measures and compiles transaction performance data including transaction processing times for various components within the enterprise system, error messages generated, and the like.

The present invention uses the MD4 checksum for a transaction as a primary key to a system table containing common information for all occurrences of the transaction. MD4 checksum, also called RSA-MD4, calculates a checksum using the RSA MD4 algorithm. This algorithm takes as an input an input message of an arbitrary length and produces a 128-bit (16 octet) checksum. Although the illustrative examples in the present invention are described in terms of the MD4 checksum, it should be noted that any checksum, which generates the same output when given the exact same sequence of inputs and whose output is unique for each arbitrary sequence of inputs, may be used.

A checksum is an integrity protection measure that is performed by adding up components in a string of data and storing the data. It may later be verified that the object was not corrupted by performing the same operation on the data, and checking the "sum". In the present invention, the checksum is used as the Universal Unique IDentifier (UUID) for the transaction. For example, a UUID may be generated from MD4 checksums of the host string, user string, application string, and transaction string of a transaction.

A transaction UUID may be linked to other UUIDs of related transactions through the correlator. For example, when a child transaction is created, the correlator passes the UUID or checksum of the parent transaction to the child transaction. As mentioned previously, correlators are used to express a relationship between two or more transactions. Correlators are used to parse a complex transaction into parent/child relationships, wherein each child or sub-transaction may have sub-transactions of its own. A correlator typically contains information regarding the user transaction, such as, for example, the unique transaction ID, whether the transaction request was completed, and the amount of time that elapsed before the transaction was completed.

In particular, the mechanism of the present invention provides a relationship table, or RelationMap, which contains the following information for each transaction:

RootTransactionUUID
ParentTransactionUUID
CurrentTransactionUUID

When a transaction is created, the transaction inserts a row describing its topology into this relationship table. The topology includes information regarding the current transaction UUID, its root transaction UUID, and its parent transaction UUID. These UUIDs are used as the primary key into a system table which contains links to table rows that describe the common transaction information.

By using the MD4 checksum UUIDs as the primary key to a system table containing common information for all occurrences of the transaction, it is not necessary to wait for related machine data to be uploaded to the server in order to insert the node information and preserve the topology information. Thus, no processing is necessary to build the transaction linkages for the uploaded data.

For example, if a child transaction "55" is uploaded, this child transaction knows that his parent transaction is "54" and his root transaction is "1". Despite not knowing anything else about these related transactions, the child transaction populates the system table with its own transaction information, and then populates the system table with the primary key information. This primary key information describes what the child transaction's parent and root transactions will be saved under when they are uploaded to the server at a later time. Thus, although the root/parent primary keys may not actually exist in the relationship table describing the child transaction's attributes, when the root/parent transaction information is uploaded to the server, the root/parent transaction information is populated into the system table and the child transaction is automatically linked with the newly uploaded transaction nodes.

Although the illustrative examples in the present invention describes using tables to store transaction information, it must be noted that any data structure may be used to store transaction information, such as database lists, arrays, etc.

Figure 4:
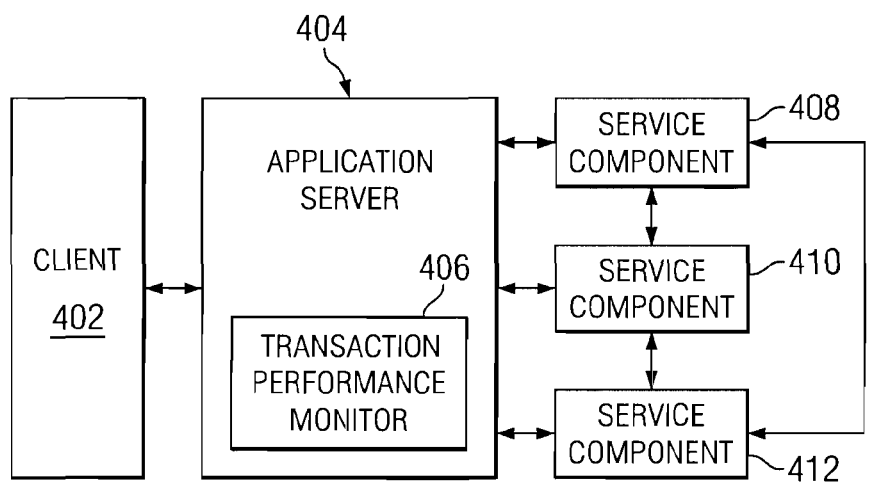
FIG. 4 is a block diagram illustrating example components used in monitoring a transaction in a distributed data processing system in accordance with a preferred embodiment of the present invention.

Turning now to FIG. 4, a block diagram illustrating example components used in monitoring a transaction in a distributed data processing system in accordance with a preferred embodiment of the present invention is shown. Client 402 is an example of a client, such as clients 108, 110, and 112 in FIG. 1. Application server 404 is a process on a data processing system, such as server 104 in FIG. 1, and may function as a combined web server/application server.

In this example, client 402 sends a request to application server 404. The request may take many forms, such as an HTTP or web service request. The request may also contain a correlator, which allows transaction performance monitor 406 to correlate this transaction to another transaction or subtransaction.

Application server 404 acts as an intermediary between the client request and the application components that need to run to provide the requested service Application server 404 invokes the appropriate service component to service the request, such as service components 408, 410, or 412. Service components 408, 410, and 412 each contain all of the logic necessary to perform a specific function. Service component 408, 410, or 412 interprets the request, performs the desired function, and sends a reply to application server 404. This reply is then delivered to client 402.

FIG. 5 is a database schema for implementing a preferred embodiment of the present invention. Database schema 500 may be implemented in a database which stores and links uploaded transactions.

In this illustrative example, database schema 500 comprises host table 502, application table 504, user table 506, and transaction table 508. Host table 502 includes host_id 510 and hostname 512 fields. Similarly, application table 504 includes appl_id 514 and appl_name 516 fields, user table 506 includes user_id 518 and username 520 fields, and transaction table 508 includes tx_id 522 and tx_name 524 fields. The values within hostname 512, appl_name 516, username 520, and tx_name 524 fields are used when a checksum is created to verify the values in these fields.

For example, when a transaction occurs in an application, the ARM engine uses the related transaction strings (in this example, hostname 512, appl_name 516, username 520, and tx_name 524) to generate a checksum of those values. The generated checksum is used as a unique ID (UUID) for this transaction. Current_node_id 526 in node table 528 is the MD4 checksum that is used to identify this transaction. As shown by current_node_id 526, the generated checksum of host/application/user/transaction strings provides the primary key into node table 528. If this particular transaction occurs again on this machine at a later time, these same values passed to the ARM engine will generate the same checksum, and thus the same UUID. This checksum value or UUID is then passed through the correlator to any child transactions that occur.

An entry into RelationMap table 530 is created for each transaction when a node in a topology is uploaded to the database that the database has not seen before. RelationMap table 530 contains the topology information for each transaction. For example, RelationMap 530 includes current_node_id 532, parent_node_id 534, and root_node_id 536. Current_node_id 532 is the MD4 checksum that is used to identify this transaction. Parent_node_id 534 is the MD4 checksum identifying the parent transaction. Root node_id 536 is the root transaction MD4 checksum identifying the root transaction information. With the very first transaction that occurs, since there is no parent_node_id, this transaction is considered the root_node_id for this transaction tree. This root_node_id is passed down to all child transactions and remains unmodified in the correlator for the entire transaction tree. For example, as a child transaction is created from a parent transaction, the child transaction generates its own UUID, or current_node_id. The UUID identifying the parent transaction received through the correlator from the parent transaction is used as the parent_node_id 534. The UUID identifying the root transaction received through the correlator from the parent transaction is used as the root_node_id 536. This process is repeated as the current child transaction becomes a parent for subsequent child transactions, on down to the leaf transactions node.

When transaction data arrives at a host, the current_node_id value from the RelationMap table is used to query the node table. From this query, the UUIDs for the host/application/user/transaction tables may be obtained. From these UUIDs, a query may be performed to obtain the information for a particular transaction. In addition, in order to retrieve the strings for the transaction's parent or root transaction, the parent_node_id or root_node_id may be used to query and obtain the information about these related transactions.

Thus, the UUIDs are used as memory pointers to a transaction's related nodes. While the MD4 checksum provides repeatable "memory" locations for different occurrences of the same node, the RelationMap table binds these relationships together to form a node in the tree topology, shown below.

Figure 6A:
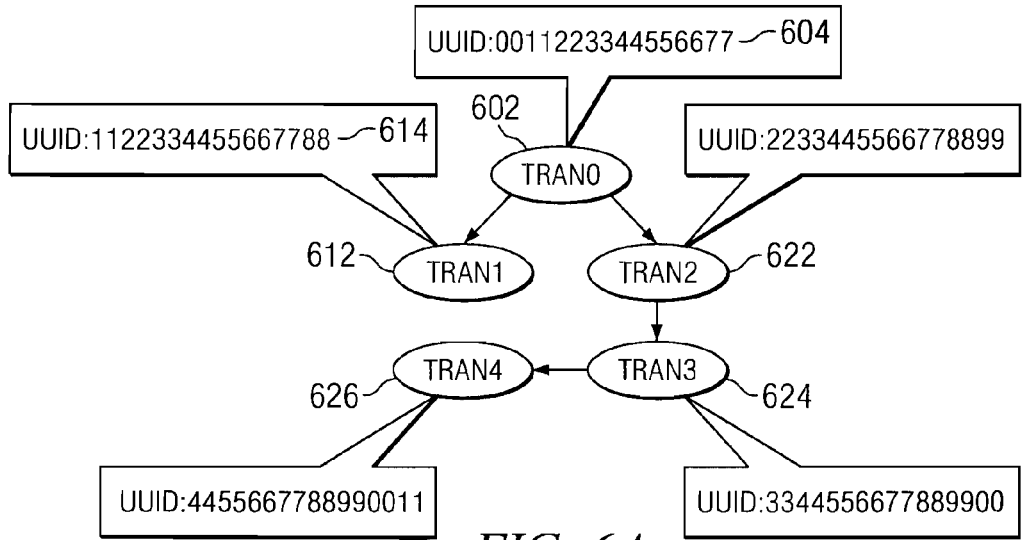
FIGS. 6A and 6B illustrate a transaction tree topology in accordance with a preferred embodiment of the present invention.
Figure 6B:
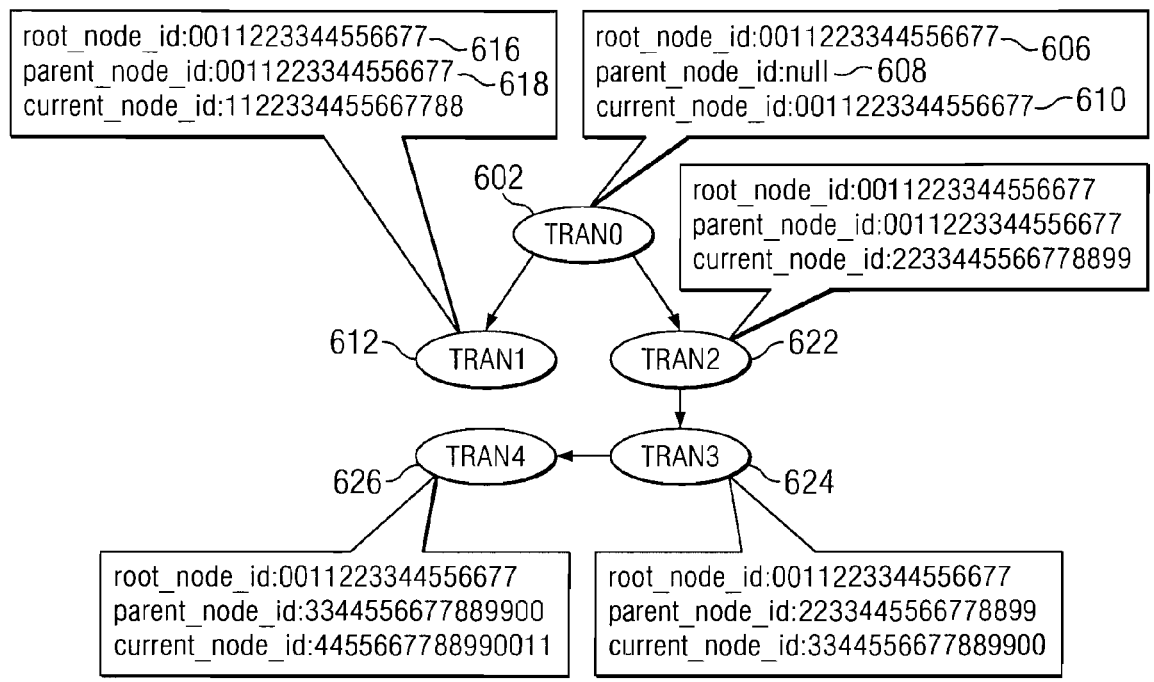

Turning now to FIGS. 6A-6B, an example transaction tree topology in accordance with a preferred embodiment of the present invention is shown. In particular, FIGS. 6A-6B illustrate how a tree topology is built and stored within a database. This topology may be implemented in a data processing system, such as data processing system 100 in FIG. 1.

In particular, FIG. 6A illustrates tree topology 600 having related transactions with their corresponding UUIDs. Trans0 602 is considered the root node, or edge transaction, for this tree topology. When trans0 602 is created, trans0 generates its own UUID, such as UUID: 0011223344556677 604. Since trans0 602 is the initial transaction, the root_node_id and current_node_id for trans0 602 are equal, and trans 602 has no parent transaction. Consequently, as shown in FIG. 6B, when the database is populated with transaction information for trans0 602, root_node_id 606 is set to be equal to current_node_id 610 for that transaction, and parent_node_id 608 is set to null. The host/application/user/transaction tables are populated as necessary and a row is created in the node table with the current_node_id value as the primary key to another system table containing common information for all occurrences of the transaction. In addition, identifying information for the host/app/user/transaction entries may be accessed via database sequenced IDs which are included as columns in the inserted row.

Trans1 612 generates its own UUID 614. As trans1 612 is considered a subtransaction of trans0 602, its root_node_id 616 is set to the UUID for Trans0 602, and its parent_node_id 618 is also set to the UUID for trans0 602. The database is then populated with these ID values. The UUIDs for trans 2 622, trans3 624, and trans4 626 are generated in a similar manner.

In order to draw the tree topology for a specific transaction, a query for all root transactions is performed by querying the RelationMap table where parent_node_id is null. The result is a list of all entry points into an ARM instrumented application. Upon selecting one of these root nodes, the child transactions for this root node may be identified by querying the RelationMap table where parent_node_id is equal to the root_transaction_id. Further down the tree topology, child transactions may likewise be found for each node by querying the RelationMap table where the parent_node_id is equal to the current_node_id in the RelationMap table.

In this manner, when the transaction information is persisted for a child transaction, such as Trans4, the transaction information is inserted into the tables as described above. If the transaction information for Trans0-3 have not yet been persisted, a query for the transaction information for Trans4 will not return any information regarding the transaction's parent or root. However, Trans4 is persisted in such a manner that when Trans0-3 are uploaded to the server database, no query or update of Trans4's database record is necessary since it is automatically linked with its associated transactions.

FIG. 7 is a flowchart of a process for using MD4 checksum as primary keys to link transactions across machines in accordance with a preferred embodiment of the present invention. This process is performed to populate a database with transaction information to link the transaction to other related transactions in an efficient manner. To facilitate this process, the client may retain the transaction data for each node in memory. The client may create a set of files in a format similar to the format of the tables in the database to allow for easily persisting the transaction data directly into the database.

easily persisting the transaction data directly into the database.

The process begins by uploading a transaction from a client into a transaction database (step 702). This upload includes the checksum for the transaction. A determination is then made as to whether an entry for the transaction exists in the RelationMap (step 704). If so, the host/application/user/transaction and node tables are presumed to have already been populated, and the process terminates.

If there is not an entry for the transaction in the RelationMap table, an entry is inserted into the node table (step 706). Values of the current transaction are populated into this entry in the node table. This entry comprises the linkings of the current transaction ID (i.e., checksum) to the transaction information in the host/application/user/transaction tables. Next, an entry is inserted in RelationMap table (step 708). Values of the current transaction are populated into this entry in the RelationMap table. This entry describes the transaction's topology and comprises the current node ID (i.e., checksum), the parent node ID, and the root node ID for the transaction.

In addition, aggregates and instance information may be persisted once the entries above have been made to the RelationMap table. The transaction is persisted into an instance or aggregate table linking back to the RelationMap table by inserting the RelationMap database ID into the instance or aggregate table (step 710).

Once an entry has been made to the RelationMap table for the transaction, when a related transaction, such as the root or parent transaction, is later uploaded to the database, the current node ID (i.e., checksum) in the RelationMap table entry created in the process steps above is used as the primary key into a system table containing the common transaction information for the particular transaction (step 712). By populating the RelationMap table with the transaction UUID and related parent and root UUIDs in the process above, the newly updated transaction (e.g., root/parent) may be automatically linked to its related transactions when data is uploaded from the client to a transaction database.

Thus, the present invention preserves relationship information for a transaction using checksums as primary keys to link transactions across machines. The advantages of the present invention should be apparent in view of the detailed description provided above. Links between related transactions may be established when data is uploaded to a transaction database using existing methods. However, such a task has proven to be inefficient and time-consuming since processing time is needed to build the transaction's linkages when the transaction is uploaded. In contrast, the mechanism of the present invention allows for automatically linking the relationship topology for a transaction as transaction data is uploaded from each host. By using the checksum as the primary key, it is not necessary to wait for related machine data to be uploaded to the server in order to insert the transaction information and preserve the topology information. In this manner, no processing is necessary to build the linkage for the uploaded data.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for using checksums to link transactions across machines, comprising:
   receiving transaction information for a current transaction, wherein transaction information comprises checksum and topology information, wherein the topology information comprises a first checksum for the current transaction, a second checksum for a parent transaction of the current transaction, and a third checksum for a root transaction of the current transaction, wherein the first checksum, the second checksum, and the third checksum in the topology information are used to identify a root/parent/current transaction relationship, and wherein the first checksum serves as a unique identifier of the current transaction;
   populating a data record in a first data structure in a transaction database with the first checksum and attribute information for the current transaction; and
   populating a data record in a second data structure in the transaction database with the topology information, wherein populating the data record in the second data structure preserves the root/parent/current transaction relationship.

2. The method of claim 1, further comprising:
   responsive to uploading one of the parent transaction or the root transaction of the current transaction to the transaction database, automatically linking the parent transaction or the root transaction to the current transaction using the data record in the second data structure.

3. The method of claim 1, wherein the first checksum in the data record in the second data structure serves as a primary key to the data record in the first data structure.

4. The method of claim 1, wherein populating the first data structure with the first checksum and attribute information for the current transaction occurs only if the first checksum and attribute information for the current transaction is not present in the first data structure.

5. The method of claim 1, wherein transaction information is retained at a client in a format similar to a format of the first data structure and the second data structure in the transaction database to persist the transaction information directly into the transaction database.

6. The method of claim 1, wherein populating the data record in the second data structure with the topology information occurs only if a data record for the current transaction is not present in the second data structure.

7. The method of claim 1, wherein the attribute information includes at least one of a hostname information, application information, and username information.

8. The method of claim 1, wherein the first data structure is a node table.

9. The method of claim 1, wherein the second data structure is a relationmap table.

10. The method of claim 1, wherein hostname information, application information, and username information for the current transaction is used in a checksum operation to generate the first checksum.

11. The method of claim 1, further comprising:
responsive to populating the data record in the second data structure with topology information, persisting aggregates and instance information for the current transaction by inserting an ID for the second data structure into an instance or aggregate data structure.

12. A data processing system for using checksums to link transactions across machines, comprising:
a bus;
a memory connected to the bus, wherein the memory contains computer usable code;
at least one managed device connected to the bus;
a communications unit connected to the bus;
a processing unit connected to the bus, wherein the processing unit executes the computer usable code to receive transaction information for a current transaction, wherein transaction information comprises checksum and topology information, wherein the topology information comprises a first checksum for the current transaction, a second checksum for a parent transaction of the current transaction, and a third checksum for a root transaction of the current transaction, wherein the first checksum, the second checksum, and the third checksum in the topology information are used to identify a root/parent/current transaction relationship, and wherein the first checksum serves as a unique identifier of the current transaction; populate a data record in a first data structure in a transaction database with the first checksum and attribute information for the current transaction; and populate a data record in a second data structure in the transaction database with the topology information, wherein populating the data record in the second data structure preserves the root/parent/current transaction relationship.

13. The data processing system of claim 12, wherein the processing unit further executes computer usable code to automatically link the parent transaction or the root transaction to the current transaction using the data record in the second data structure in response to uploading one of the parent transaction or the root transaction of the current transaction to the transaction database.

14. The data processing system of claim 12, wherein the first checksum in the data record in the second data structure serves as a primary key to the data record in the first data structure.

15. The data processing system of claim 12, wherein population of the first data structure with the first checksum and attribute information for the current transaction occurs only if the first checksum and attribute information for the current transaction is not present in the first data structure.

16. The data processing system of claim 12, wherein transaction information is retained at a client in a format similar to a format of the first data structure and the second data structure in the transaction database to persist the transaction information directly into the transaction database.

17. The data processing system of claim 12, wherein populating the data record in the second data structure with the topology information occurs only if a data record for the current transaction is not present in the second data structure.

18. The data processing system of claim 12, wherein the attribute information includes at least one of a hostname information, application information, and username information.

19. The data processing system of claim 12, wherein the first data structure is a node table.

20. The data processing system of claim 12, wherein the second data structure is a relationmap table.

21. The data processing system of claim 12, wherein hostname information, application information, and username information for the current transaction is used in a checksum operation to generate the first checksum.

22. The data processing system of claim 12, further comprising:
responsive to populating the data record in the second data structure with topology information, persisting aggregates and instance information for the current transaction by inserting an ID for the second data structure into an instance or aggregate data structure.

23. A computer program product in a computer storage-type medium for using checksums to link transactions across machines, comprising:
first instructions for receiving transaction information for a current transaction, wherein transaction information comprises checksum and topology information, wherein the topology information comprises a first checksum for the current transaction, a second checksum for a parent transaction of the current transaction, and a third checksum for a root transaction of the current transaction, wherein the first checksum, the second checksum, and the third checksum in the topology information are used to identify a root/parent/current transaction relationship, and wherein the first checksum serves as a unique identifier of the current transaction;
second instructions for populating a data record in a first data structure in a transaction database with the first checksum and attribute information for the current transaction; and
third instructions for populating a data record in a second data structure in the transaction database with the topology information, wherein populating the data record in the second data structure preserves the root/parent/current transaction relationship.

24. The computer program product of claim 23, further comprising:
fourth instructions for automatically linking the parent transaction or the root transaction to the current transaction using the data record in the second data structure in response to uploading one of the parent transaction or the root transaction of the current transaction to the transaction database.

25. The computer program product of claim 23, wherein the first checksum in the data record in the second data structure serves as a primary key to the data record in the first data structure.

26. The computer program product of claim 23, wherein populating the first data structure with the first checksum and attribute information for the current transaction occurs only if the first checksum and attribute information for the current transaction is not present in the first data structure.

27. The computer program product of claim 23, wherein transaction information is retained at a client in a format similar to a format of the first data structure and the second data structure in the transaction database to persist the transaction information directly into the transaction database.

28. The computer program product of claim 23, wherein populating the data record in the second data structure with the topology information occurs only if a data record for the current transaction is not present in the second data structure.

29. The computer program product of claim 23, wherein the attribute information includes at least one of a hostname information, application information, and username information.

30. The computer program product of claim 23, wherein the first data structure is a node table.

31. The computer program product of claim 23, wherein the second data structure is a relationmap table.

32. The computer program product of claim 23, wherein hostname information, application information, and username information for the current transaction is used in a checksum operation to generate the first checksum.

33. The computer program product of claim 23, further comprising:
fourth instructions for persisting aggregates and instance information for the current transaction by inserting an ID for the second data structure into an instance or aggregate data structure in response to populating the data record in the second data structure with topology information.

* * * * *